(12) United States Patent
Maeshima et al.

(10) Patent No.: US 8,048,476 B2
(45) Date of Patent: Nov. 1, 2011

(54) METHOD OF MANUFACTURING PLASMA DISPLAY PANEL

(75) Inventors: Satoshi Maeshima, Hyogo (JP); Yoshimasa Takii, Osaka (JP); Masashi Morita, Osaka (JP); Yoshiyasu Honma, Osaka (JP); Mitsuo Saitoh, Osaka (JP)

(73) Assignee: Panasonic Corporation, Osaka (JP)

( * ) Notice: Subject to any disclaimer, the term of this patent is extended or adjusted under 35 U.S.C. 154(b) by 433 days.

(21) Appl. No.: 11/720,270

(22) PCT Filed: Nov. 10, 2006

(86) PCT No.: PCT/JP2006/322433
§ 371 (c)(1),
(2), (4) Date: May 25, 2007

(87) PCT Pub. No.: WO2007/055304
PCT Pub. Date: May 18, 2007

(65) Prior Publication Data
US 2009/0227170 A1   Sep. 10, 2009

(30) Foreign Application Priority Data
Nov. 10, 2005   (JP) .................. 2005-325670

(51) Int. Cl.
*B05D 5/06* (2006.01)
*C23C 16/52* (2006.01)
(52) U.S. Cl. ................. 427/69; 427/8; 427/68
(58) Field of Classification Search ............... 427/8, 68, 427/69
See application file for complete search history.

(56) References Cited

U.S. PATENT DOCUMENTS

| 4,147,958 A * | 4/1979 | Ahearn et al. ............. 315/169.4 |
| 2002/0008817 A1* | 1/2002 | Ito et al. .................. 349/122 |
| 2006/0003087 A1 | 1/2006 | Takase et al. |

FOREIGN PATENT DOCUMENTS

| JP | 10-106441 | 4/1998 |
| JP | 2000-017431 | 1/2000 |
| JP | 2000-087225 | 3/2000 |
| JP | 2005-050803 | 2/2005 |
| JP | 2005-050804 | 2/2005 |
| JP | 2005-50804 A | 2/2005 |
| JP | 2005-129521 | 5/2005 |
| JP | 11-335820 | 12/2005 |

OTHER PUBLICATIONS

Chinese Office Action dated Mar. 27, 2009.
International Search Report (PCT/JP2006/322433) dated Feb. 13, 2007.

* cited by examiner

*Primary Examiner* — James Lin
(74) *Attorney, Agent, or Firm* — Pearne & Gordon LLP

(57) ABSTRACT

Evaporation chamber for depositing a protective film on a surface, where a dielectric layer is formed, of front substrate, front substrate is formed a display electrode and the dielectric layer thereon; transporting unit for transporting front substrate into evaporation chamber; gas introducing units for introducing gas containing $H_2O$ into evaporation chamber; and partial pressure detecting unit for measuring a certain partial pressure of gas within evaporation chamber, extending from the center of deposition space of evaporation chamber to the downstream of transport direction of front substrate are provided. Gas containing $H_2O$ is introduced from gas introducing units such that the partial pressure of gas is controlled in the partial pressure detecting unit.

2 Claims, 4 Drawing Sheets

METHOD OF MANUFACTURING PLASMA DISPLAY PANEL

This application is a U.S. national phase application of PCT International Application PCT/JP2006/322433 filed Nov. 10, 2006.

TECHNICAL FIELD

The present invention relates generally to a plasma display panel (hereinafter, briefly referred to as "PDP"). More particularly, the present invention relates to a technology for stably controlling the electron emission characteristics of metal oxide film employed as protective film of PDPs.

BACKGROUND ART

In recent years, among color display devices such as a personal computer or a television used to display an image, flat display panels including liquid crystal display panels (LCDs), field emission display panels (FEDs) and PDP have attracted an attention as a display device which enables a large-sized and thin-sized panel. In particular, the PDP has a remarkable advantage such as a fast response and a wide viewing angle.

The PDP has a structure such that a front plate and a rear plate are oppositely arranged and then the circumference thereof is hermetically sealed by sealing parts. Discharge gas, such as Ne, Xe and others, is enclosed within discharge spaces formed between the front plate and the rear plate.

The front plate includes a plurality of display electrode pairs made up of, in pairs, a sustain electrode and a scan electrode formed on a glass substrate in a stripe arrangement, a dielectric layer covering the display electrode pair, and a protective film covering the dielectric layer. The display electrode pair is made up of a transparent electrode, and a bus electrode made of metal material and formed on the transparent electrode.

On the other hand, the rear plate includes a plurality of address electrodes formed on a glass substrate in a stripe arrangement; an underlying dielectric layer for covering the address electrode; a barrier rib for partitioning discharge space for every address electrode and formed on the underlying dielectric layer; and a phosphor layer emitting red light, green light and blue light, which is formed on the underlying dielectric layer disposed between the barrier ribs, and at a side face of the barrier rib.

The front plate and the rear plate are oppositely arranged such that the display electrode pairs are perpendicular to the address electrode, and a discharge cell is formed in an intersection portion of these electrodes. The discharge cells are arranged in a matrix, and a pixel for color display includes 3 discharge cells having a phosphor layer of Red, Green and Blue colors. The phosphor layer is arranged toward the direction of the display electrode pairs. The PDP displays color images in such a manner that predetermined voltage is applied between the scan electrode and the address electrode, and between the scan electrode and the sustain electrode to create gas discharge, and then a phosphor layer is excited and radiated by ultraviolet rays produced by the gas discharge.

As to such a structure of PDP, there is required that the protective film has a better resistance to sputtering and a high secondary electron emission coefficient, etc., and, for example, as the protective film, the magnesium oxide (MgO) film is widely employed. The resistance to sputtering and the emission characteristics of secondary electron permit preventing the sputtering of the dielectric layer and reducing discharge voltage.

The protective film is formed using electron beam evaporation or plasma gun deposition and the like, the significant differences of characteristics between obtained films occurs according to deposition methods, deposition condition, etc. There is known that the characteristic of the secondary electron emission of magnesium oxide (MgO) film employed as the protective film is varied by impurities incorporated into during the deposition process. The reason is that if oxygen exists insufficiently within a film, or impurities, such as $H_2$ molecular and the like originated from water ($H_2O$) included in magnesium oxide or atmosphere gas, are incorporated into the film, combinations of Mg atom and O atom within the magnesium oxide (MgO) film are disordered. In other words, during such combination, uncombined bonds (dangling bond) occur, thus influencing the energy band of magnesium oxide (MgO) and in turn changing the emission state of the secondary electron.

In view of the above, in the case that magnesium oxide (MgO) as a protective film is formed by means of using electron beam evaporation, an example in which the protective film having better film characteristics can be stably manufactured by introducing the gases including Oxygen gas or Water ($H_2O$) into an evaporation chamber and then controlling the partial pressure of various gases in a constant range, has disclosed (As an example, see Patent document 1).

However, in the known deposition apparatus as disclosed in Patent document 1, in which protective film is continuously formed while a substrate is conveyed, it is difficult to uniformly form atmosphere across an entire evaporation chamber. In particular, in the case that the gases including water ($H_2O$) as impurity gas are introduced into the evaporation chamber, since influenced by a temperature distribution within the evaporation chamber, the decomposition of water ($H_2O$) by electron beam and the like, water molecule existing within the chamber is undesirably distributed. Therefore, stable control of film quality can not be performed. As a consequence, the electron emission characteristics of the protective film can not be stably controlled, and thus the non-lighting of pixel or the malfunction of lighting in the PDP can occur.

[Patent Document 1] Japanese Patent Unexamined Publication No. 2005-50804

DISCLOSURE OF THE INVENTION

A method of manufacturing a PDP of the invention includes: introducing a substrate, where a display electrode and a dielectric layer are formed, into a film forming chamber; and depositing metal oxide successively on a surface, where the dielectric layer is formed, of the substrate while the substrate is transported. Further, when the metal oxide is deposited, a certain partial pressure of gas in the film forming chamber extending from a center of a deposition space of the film forming chamber to a downstream side in a transport direction of the substrate is measured, and gas containing $H_2O$ is introduced into the film forming chamber based on the measured partial pressure.

With such a manufacturing method, better film quality of metal oxide as protective film in which the electron emission characteristics is stably controlled, can be formed on the substrate of a PDP in a fast speed.

REFERENCE MARKS IN THE DRAWINGS

Figure 1:
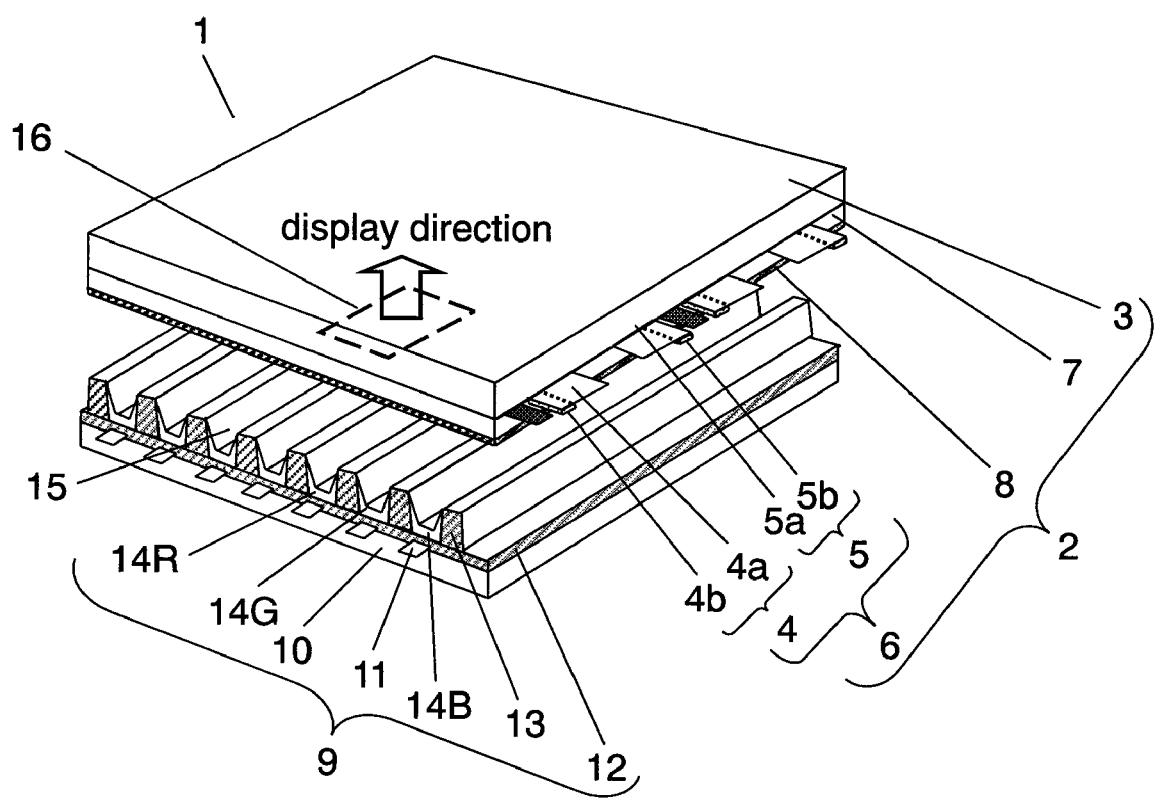
FIG. 1 is a perspective view illustrating a structure of a surface discharge type AC PDP.

1 PDP (plasma display panel)
2 front plate
3 front substrate
4 scan electrode
4a, 5a transparent electrode
4b, 5b bus electrode
5 sustain electrode
6 display electrode
7 dielectric layer
8 protective film
9 rear plate
10 rear substrate
11 address electrode
12 underlying dielectric layer
13 barrier rib
14r, 14g, 14b phosphor layer
15 discharge space
16 discharge cell
20 deposition apparatus
21 evaporation chamber
22 substrate loading room
23 substrate unloading room
24a, 24b, 24c vacuum exhausting system
25 transporting unit
26a, 26b, 26c, 26d partition
27a, 27b substrate heating unit
28a evaporation source
28b hearth
28c electron gun
28d electron beam
28e vapor flow
28g, 28h shutter
29a, 29b gas introducing unit
29c partial pressure detecting unit
30 substrate holding instrument

DETAILED DESCRIPTION OF PREFERRED EMBODIMENTS

The manufacturing method of a PDP according to an embodiment of the invention will be described in more detail with reference to drawings.

Exemplary Embodiment

FIG. 1 is a perspective view illustrating a structure of a surface discharge type AC PDP. In the PDP, row electrodes and column electrodes are perpendicularly arranged on a front plate and a rear plate respectively, and a discharge space is defined by intersection between the row electrode and the column electrode which constitutes a pixel, and barrier ribs formed between both plates. The front plate and the rear plate respectively made of glass.

In FIG. 1, front plate 2 of PDP 1 includes front substrate 3; display electrode 6 having scan electrode 4 and sustain electrode 5; dielectric layer 7 covering display electrode 6; and protective film 8 covering dielectric layer 7 and made of, for example magnesium oxide (MgO). Scan electrode 4 and sustain electrode 5 are formed on one surface (i.e., a main surface) of transparent and insulating front substrate 3 made of glass, for example. Each scan electrode 4 and each sustain electrode 5 include both transparent electrodes 4a and 5a and bus electrodes 4b and 5b. In this case, bus electrodes 4b, 5b, for example made of metal material such as Ag is stacked on transparent electrodes 4a, 5a in order to reduce an electrical resistance.

In addition, rear plate 9 includes insulating rear substrate 10 such as glass; address electrode 11 formed on one surface of rear substrate 10; underlying dielectric layer 12 covering address electrode 11; barrier rib 13 disposed between adjacent address electrodes 11 and on underlying dielectric layer 12; and phosphor layers 14R, 14G and 14B respectively emitting Red (R), Green (G) and Blue (B) light, and formed by a application between each barrier rib 13.

Barrier rib 13 is sandwiched between front plate 2 and rear plate 9, front plate 2 and rear plate 9 are oppositely arranged such that display electrode 6 is perpendicular to address electrode 11. The circumference other than image display region of PDP 1 is hermetically sealed by sealing parts (not shown). Discharge gas is enclosed in discharge space 15 formed between front plate 2 and rear plate 9, in pressure of about 66.5 kPa (500 Torr). In this case, the discharge gas, for example, is made of mixed noble gas in which neon (Ne) gas is mixed with 10% of xenon (Xe) gas. Further, the intersection portion between display electrode 6 and address electrode 11 in discharge space 15 serves as discharge cell 16 (unit of emission region).

The process for manufacturing PDP 1 described above will now be described in more detail. With respect to front plate 2, first, scan electrode 4 and sustain electrode 5 are formed on front substrate 3 in a stripe form. Specifically, a transparent conductive film, such as for example ITO and the like, is formed on front substrate 3 by means of deposition process, such as vapor evaporation, sputtering, etc., and then patterned by means of photolithography, etc. to form transparent electrodes 4a and 5a. Further, a film made of for example Ag, etc., is laminated on transparent electrodes 4a, 5a by means of deposition process including printing, vapor evaporation, etc., and thereafter patterned using photolithography and the like to form bus electrodes 4b, 5b. Thus, display electrode 6 including scan electrode 4 and sustain electrode 5 can be obtained.

Subsequently, display electrode 6 formed in a manner described above, is covered with dielectric layer 7. Dielectric layer 7 can be formed by applying a paste containing lead-based glass material by means of, for example, a screen printing method, and then baked with heating. Example of such a paste containing lead-based glass material includes a mixture made of glass material of PbO(70 wt %)—$B_2O_3$(15 wt %)—$SiO_2$(10 wt %)—$Al_2O_3$(5 wt %) and organic material. In this case, the organic material contains binder in which ethyl cellulose is dissolved into 10% of alpha-terpineol. Subsequently, thus obtained dielectric layer 7 which is formed on display electrode 6, is covered with metal oxide, such as magnesium oxide (MgO), as a protective film 8. The process for forming protective film 8 will be described in more detail later, along with a deposition apparatus to be used in the exemplary embodiment.

On the other hand, with respect to rear plate 9, first, a plurality of striped address electrodes 11 are formed on rear substrate 10. Specifically, a film made of conductive material, such as Ag, etc., is formed on one surface of rear substrate 10, by means of deposition process including printing, vapor evaporation, etc., and then patterned by means of photolithography and the like to form address electrode 11. Such address electrode 11 is covered with underlying dielectric layer 12, and then barrier ribs 13 are arranged in parallel and formed on underlying dielectric layer 12 and between address electrodes 11. Thereafter, paste of phosphor ink, made of phosphor particles for emitting Red (R), Green (G) and Blue (B) light, and organic binder, is applied within grooves formed between each barrier rib 13, then baked with heating to burn out the organic binder, and thereby each phosphor particle is bonded, so as to form phosphor layers 14R, 14G and 14B.

Front plate 2 and rear plate 9 manufactured in a manner as described above, are superposed such that display electrode 6 of front plate 2 is perpendicular to address electrode 11 of rear plate 9. Simultaneously, sealing parts including glass having low melting point is interposed into circumference and baked, and thus a hermetic sealing layer (not shown) is formed to enclose. As a result, once discharge space 15 is evacuated under high vacuum, thereafter discharge gas is enclosed in predetermined pressure, and thus PDP 1 is accomplished.

Figure 2:
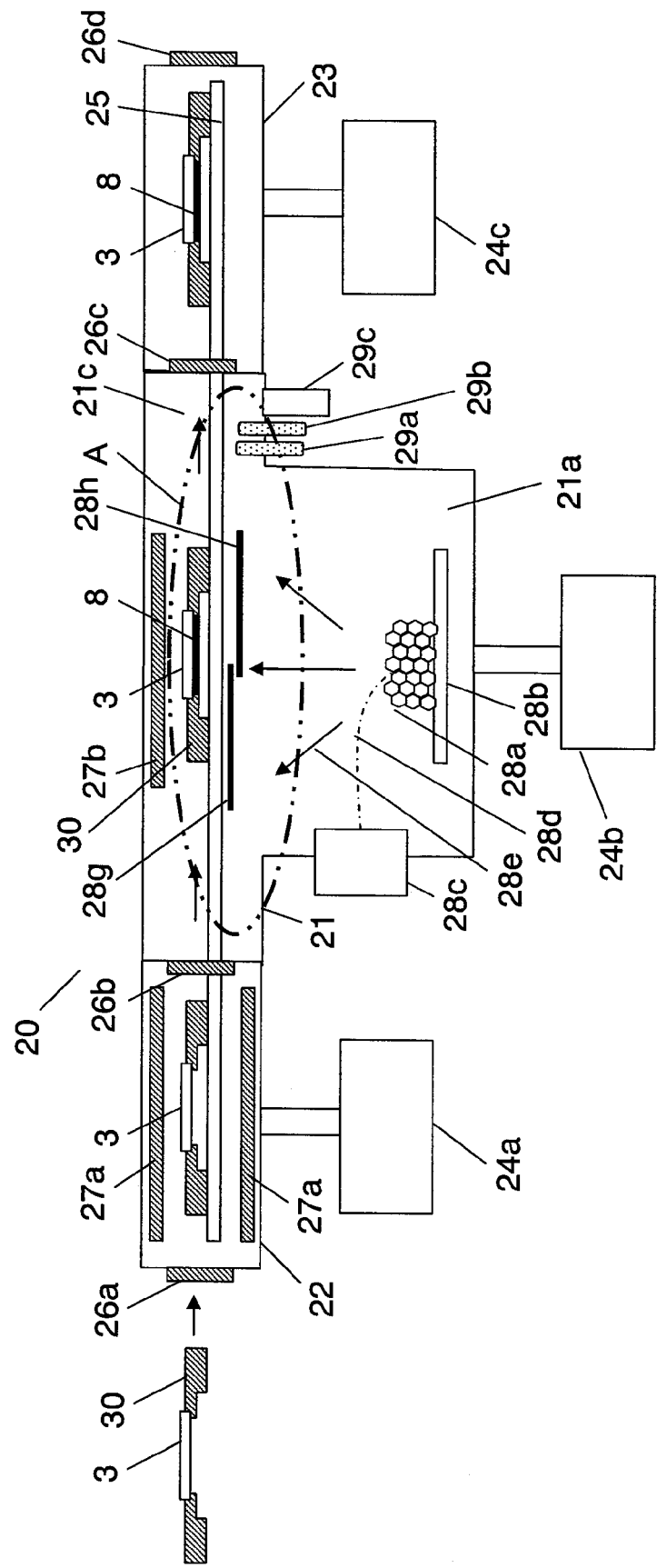
FIG. 2 is a sectional side elevation view illustrating a structure of apparatus for manufacturing PDPs, according to an embodiment of the invention.

Next, the process for forming protective film 8 as metal oxide of magnesium oxide (MgO) will be described in detail, with reference to FIG. 2. FIG. 2 is a sectional side elevation view illustrating the structure of apparatus for manufacturing PDPs according to the exemplary embodiment of the invention.

As shown in FIG. 2, deposition apparatus 20 is provided with evaporation chamber 21 which is a film forming chamber, for forming protective film 8 on front substrate 3 of PDP 1 by means of vapor evaporation. In addition, substrate loading room 22 and substrate unloading room 23 are provided to the front and rear of evaporation chamber 21. Substrate loading room 22 is provided to pre-heat front substrate 3 and simultaneously pre-exhaust before introducing front substrate 3 into evaporation chamber 21. Substrate unloading room 23 is provided to cool front substrate 3 which is carried out from evaporation chamber 21 after the completion of vapor deposition.

The substrate loading room 22, the evaporation chamber 21, and the substrate unloading room 23 each are configured as an airtight structure so as to evacuate these chambers 22, 21, 23. Further, vacuum exhausting systems 24a, 24b and 24c are provided for each chamber, independently. Transporting unit 25 including a conveyer roller, a wire, a chain and the like, is arranged so as to pass through substrate loading room 22, evaporation chamber 21 and substrate unloading room 23. Additionally, partitions 26a, 26b, 26c and 26d capable of opening and closing, are provided and isolated between external air and substrate loading room 22, between substrate loading room 22 and evaporation chamber 21, between evaporation chamber 21 and substrate unloading room 23, and between substrate unloading room 23 and external air, respectively.

The operation of transporting unit 25 is cooperated with the opening and closing of partitions 26a, 26b, 26c, 26d, and thereby the variation of the degree of vacuum is suppressed in each substrate loading room 22, evaporation chamber 21 and substrate unloading room 23. Front substrate 3 on which dielectric layer 7 is formed, is introduced into substrate loading room 22 of deposition apparatus 20 from an exterior via partition 26a, passed through evaporation chamber 21 and substrate unloading room 23 to treat predetermined processing in each chamber, and a processed substrate is carried out from deposition apparatus 20 to the exterior. In this manner, a sheet-fed processing manner in which magnesium oxide (MgO) film is successively formed on a plurality of front substrates 3 can be performed. Substrate heating units 27a and 27b for heating front substrate 3 are provided to both substrate loading room 22 and evaporation chamber 21. The transporting of front substrate 3 is performed, in a state the front substrate 3 is loaded onto a tray, generally referred to substrate holding instrument 30.

Evaporation chamber 21 which is a film forming chamber will be described herein below. With respect to evaporation chamber 21, hearth 28b for containing particles of magnesium oxide (MgO) primarily serving as evaporation source 28a, electron gun 28c and deflection magnet (not shown) for applying a magnetic field, are provided within hermetically-sealed container 21a connected to vacuum exhausting system 24b. The magnetic field produced by the deflection magnet allows deflecting electron beam 28d emitted from electron gun 28c and irradiating to evaporation source 28a to provide thermal energy, thereby vapor flows 28e are produced from evaporation source 28a.

At this time, front substrate 3 is loaded onto substrate holding instrument 30 having an opening, and transported from the left of FIG. 2 to the right by a performance of transporting unit 25. Subsequently, while shutters 28g and 28h for shuttering vapor flow 28e move and then a lower portion of substrate holding instrument 30 is maintained at a opened state, vapor flow 28e is passed through the opening of substrate holding instrument 30, adhered and deposited on the surface of front substrate 3, thereby protective film 8 of magnesium oxide (MgO) having a predetermined feature and a thickness of film is successively formed. In this case, front substrate 3 is heated to a predetermined temperature by a performance of substrate heating units 27a and 27b to which a heater, such as infrared lamp and the like is employed.

Further, as shown in FIG. 2, according to deposition apparatus which is manufacturing apparatus for manufacturing PDP in the exemplary embodiment of the invention, gas introducing units 29a and 29b for introducing gases to evaporation chamber 21, and partial pressure detecting unit 29c of evaporation chamber 21 are arranged in the vicinity of downstream protrusion 21c which is located at a side of substrate unloading room 23 in an interior of chamber 21. In this way, according to the exemplary embodiment of the invention, partial pressure detecting unit 29c permits detecting the partial pressure, in a region extending from a center of space for forming film to the downstream of transportation direction of front substrate 3 within evaporation chamber 21 which is the film forming chamber. An example of such partial pressure detecting unit 29c includes, for example, a quadrupole mass spectrometer.

As described above, in the case that protective film 8 is formed, the physical properties of protective film 8 made of magnesium oxide (MgO) is varied according to either deficiency of Oxygen or incorporation of impurities produced during a course of deposition processes. In particular, if the loss of oxygen is produced within a film, or impurities, such as H atom, $H_2$ molecular, OH molecular and the like originated from water ($H_2O$) contained in the raw material of the film or atmosphere gas, are incorporated into the film, combinations of Mg atom and O atom in the magnesium oxide (MgO) film can be disordered. As a result, due to such disorder, uncombined bonds (dangling bond) are produced, energy band of magnesium oxide (MgO) is affected, and thereby the emission state of the secondary electron can be varied. Thus, in order to suppress the occurring of these uncombined bonds, it is preferable that oxygen gas or water ($H_2O$) is introduced into evaporation chamber 21.

In the exemplary embodiment of the invention, the amount of oxygen gas or water ($H_2O$) introduced into evaporation chamber 21, is controlled, based on the results obtained from partial pressure detecting unit 29c which is positioned in the vicinity of downstream protrusion 21c located at the side of substrate unloading room 23 in the interior of evaporation chamber 21. In other words, in the exemplary embodiment of the invention, the physical properties of magnesium oxide (MgO) film due to the deficiency of oxygen or the incorporation of impurities are controlled, in particular, roughly at the time of completing deposition process.

If deposition is performed by controlling the atmosphere of evaporation chamber 21, it is difficult to obtain uniform atmosphere across entire evaporation chamber 21. In other words, the central region of evaporation chamber 21 located over hearth 28b having evaporation source 28a, and left and right ends of evaporation chamber 21 in the vicinity of substrate loading room 22 or substrate unloading room 23, are filled with different atmosphere. In particular, it is apparent that roughly at the time of completing the deposition process, front substrate 3 is transported to a position close to substrate unloading room 23 in the interior of evaporation chamber 21, and the physical properties of film affecting to the properties of protective film 8 are largely varied due to the difference between gas atmospheres within evaporation chamber 21. Accordingly, in order to obtain stable properties of protective film 8, it is preferable to properly control the state of gas during the deposition process.

In view of the above, the inventors confirmed that if the partial pressure of gas containing water ($H_2O$), roughly at the time of completing the deposition process, in evaporation chamber 21, is used as a parameter for appropriately controlling the state of gas within evaporation chamber 21 which is a film forming chamber, and the deposition process is performed with maintaining the partial pressure within a constant range, then stable and superior magnesium oxide (MgO) film can be formed. In this case, the term "partial pressure" represents the partial pressure which is measured roughly at the time of completing the deposition process in the deposition field which is space interposed between hearth 28b and front substrate 3 within evaporation chamber 21. Further, the term "roughly at the time of completing the deposition process" means a period between the time when the film is formed to the half of the entire thickness of the magnesium oxide (MgO) film and the time when the deposition process is completed.

At least one of the gas introducing units 29a and 29b is provided to evaporation chamber 21 which is the film forming chamber, in order to control atmosphere within evaporation chamber 21, especially, roughly at the time of completing the deposition process. Gas introducing units 29a and 29b are capable of introducing various gases as described above. For instance, oxygen gas may be introduced by means of gas introducing unit 29a of two gas introducing units 29a and 29b, the gas containing including water ($H_2O$) may be introduced by means of the other gas introducing unit 29b. Furthermore, in order to detect the partial pressure of gas as described above, within evaporation chamber 21 roughly at the time of completing the deposition process, partial pressure detecting unit 29c, for example including a quadrupole mass spectrometer, is provided in the vicinity of the downstream protrusion 21c at the side of substrate unloading room 23.

Control unit (not shown) for controlling the introduced amount of gas from gas introducing units 29a and 29b, and the exhausted amount of gas by vacuum exhausting system 24b, based on an information obtained from partial pressure detecting unit 29c, also is provided so as to maintain the partial pressure of gas within evaporation chamber 21 in a constant range. Hence, these aforementioned structures allow controlling and maintaining the partial pressure of gas containing an atmosphere gas, for example oxygen gas or water, within evaporation chamber 21, which is the film forming chamber, in the constant range roughly at the time of completing the deposition process, thereby performing the deposition of magnesium oxide (MgO) film.

In deposition apparatus 20 for forming protective film of the PDP in the exemplary embodiment of the invention as illustrated and described in FIG. 2, while there is illustrated as only single partial pressure detecting unit 29c is provided. However deposition apparatus 20 of the invention is not limited and a plurality of partial pressure detecting units 29c may be provided. When a plurality of partial pressure detecting units 29c are provided, it is preferable that the plurality of partial pressure detecting units are arranged so as to be perpendicular to the transport direction of substrate holding instrument 30 loading front substrate 3 and be parallel to the transport direction, since an accuracy of measurement in detecting partial pressure is enhanced.

Figure 3:
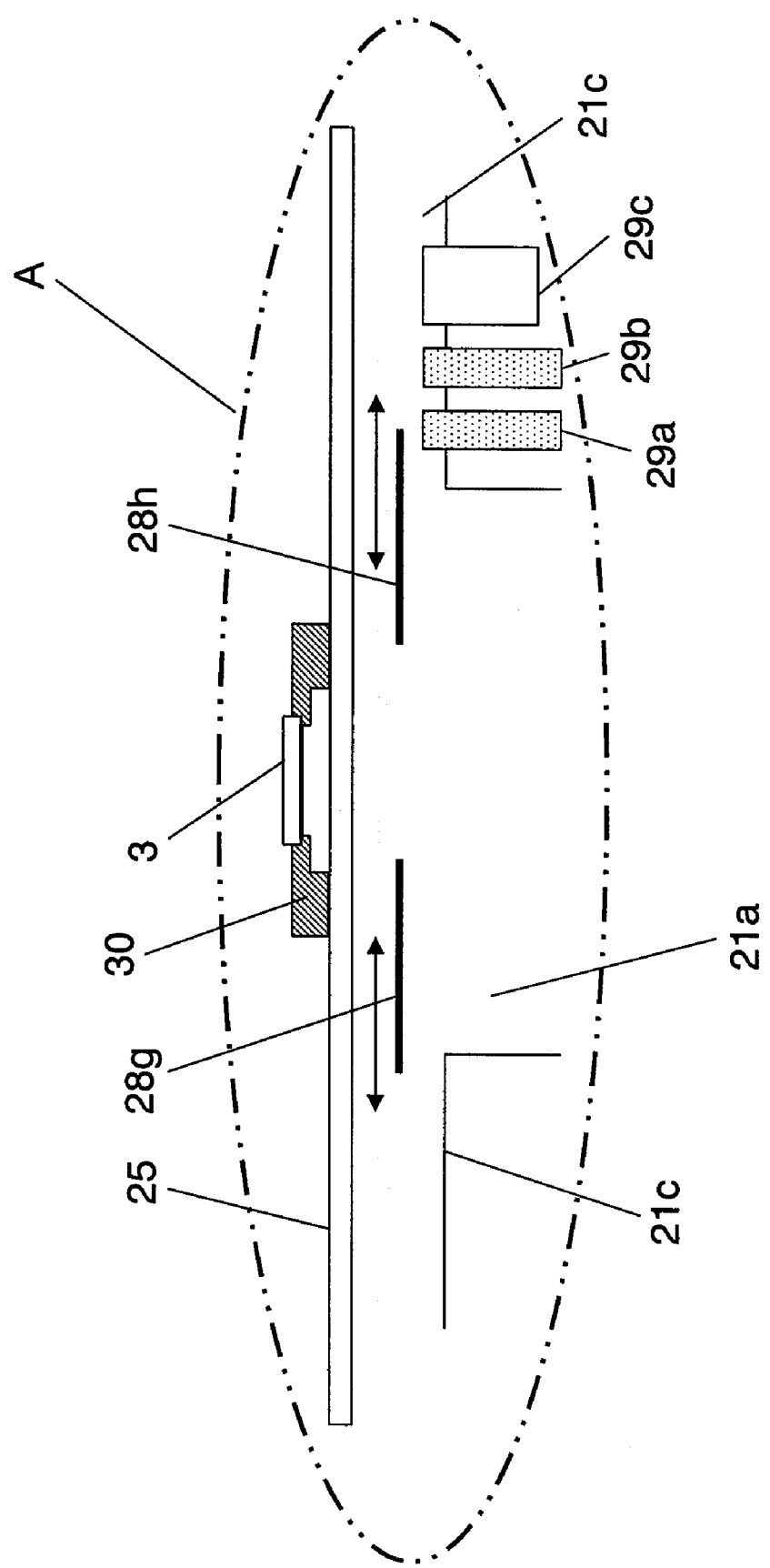
FIG. 3 is a sectional side elevation view illustrating details of portion A in FIG. 2.

As shown in FIG. 3, as to the position in which partial pressure detecting unit 29c is arranged, it is preferable that partial pressure detecting unit 29c is provided at a lower side to downstream protrusion 21c, relative to a right end of downstream isolation wall 28h, in a state that downstream isolation wall 28h moves toward downstream protrusion 21c and magnesium oxide (MgO) film can be deposited.

Next, a sequence of the deposition process will be described in detail. First, within evaporation chamber 21 which is the film forming chamber, front substrate 3 is heated by means of substrate heating unit 27b including the infrared lamp and the like, and consistently maintained in a predetermined temperature. It is preferable that the heating temperature is set to a range of about 100 degrees centigrade to 400 degrees centigrade, since display electrode 6 or dielectric layer 7 previously formed on front substrate 3 is not degraded by heating. Thereafter, in a state that upstream isolation wall 28g and downstream isolation wall 28h are closed, electron beam 28d is irradiated to evaporation source 28a from electron gun 28c, and then the gas containing the impurities which is contained in evaporation source 28a is outgased. The gas containing the impurities is exhausted from vacuum exhausting system 24b, and subsequently the gas is introduced from gas introducing units 29a and 29b. As described above, as introducing the gas, for example, oxygen or the gas containing oxygen is preferably used so as to prevent the loss of oxygen in the magnesium oxide (MgO) film, or the gas containing water is preferably used, for the purpose of intentionally incorporating impurities into the film. These gases also are controlled such that the partial pressure at the downstream of the transport direction of the substrate is maintained in the predetermined range, in the deposition field of evaporation chamber 21. Then, while the gas is exhausted from evaporation chamber 21 by means of vacuum exhausting system 24b, the gas is introduced into evaporation chamber 21 from gas introducing units 29a and 29b, and thereby the introduced amount of the gas and the exhausted amount of the gas are controlled by means of control unit (not shown), thus the exhaustion of the gas is balanced with the introduction of the gas. Thereafter, at the time that front substrate 3 to be transported is traveled into a certain position, upstream isolation wall 28g and downstream isolation wall 28h are traveled, thereby the lower portion of substrate holding instrument 30 is opened, and then vapor flow of magnesium oxide (MgO) 28e is jetted toward front substrate 3 and deposited thereon.

As a result, the amount of uncombined bonds are controlled especially in a surface layer portion of the deposited magnesium oxide (MgO) thin films formed at the later deposition process, and thereby protective film 8 made of magnesium oxide (MgO) film having improved emission characteristics of the secondary electron can be obtained.

EXAMPLES

Hereinafter, an example that protective film is deposited, PDP is manufactured experimentally according to the manufacturing process of the exemplary embodiment of the invention, and then the manufactured PDP is evaluated, will be described.

The condition of deposition apparatus according to the example is listed in following table 1.

TABLE 1

| | |
|---|---|
| Substrate temperature at the time of deposition | 300° C. |
| Transporting velocity of front substrate | 800 mm/min |
| Emission current of electron gun | 480 mA |
| Target Pressure (at inlet of vacuum exhausting system 24b) | $2.0 \times 10^{-4}$ Pa or less |
| Pressure within film forming chamber at the time of deposition (at Inlet of vacuum exhausting system 24b) | $2.0 \times 10^{-2}$ Pa |
| Range of partial pressure of $H_2O$ | $5.0 \times 10^{-4}$ Pa to $3.0 \times 10^{-3}$ Pa |
| Range of partial pressure of OH | $1.5 \times 10^{-4}$ Pa to $2.0 \times 10^{-3}$ Pa |

Referring to table 1, Oxygen gas and water ($H_2O$) were introduced from gas introducing units 29a and 29b so as to keep the partial pressure of water ($H_2O$) or the partial pressure of OH molecular constant, and thereby front plate 2 having protective film 8 of magnesium oxide (MgO) film was manufactured.

In this case, the condition that the partial pressure are maintained in a constant range, while the degree of vacuum (pressure) within evaporation chamber 21 which is the film forming chamber is maintained in a constant range, is desirable, in respect that deposition rate can be maintained constantly and a superior film can be effectively obtained. In addition, with respect to evaporation chamber 21 of the deposition apparatus 20 shown in FIG. 2, a vacuum-degree detecting unit (not shown) for detecting the degree of vacuum in the deposition field may be further provided. It is preferably that based on information about the degree of vacuum obtained from vacuum-degree detecting unit and based on the information of detected partial pressure of gas, the introduced amount of gas from gas introducing units 29a, 29b and the exhausted amount of gas by vacuum exhausting system 24b are controlled, and thereby the partial pressure of gas within evaporation chamber 21 can maintained in the predetermined range and the degree of vacuum can be maintained in a predetermined range.

In this case, inert gas including Nitrogen gas or noble gas, such as for example, argon, helium or the like, may be used to adjust the degree of vacuum in the predetermined range. It allows adjusting the degree of vacuum without affecting to the physical properties of magnesium oxide (MgO) film to be deposited. In general, it is preferable that the inert gas is used, because the inert gas does not apply the chemical action to magnesium oxide (MgO) film and therefore influences only the adjustment of degree of vacuum without affecting to the physical properties of the film.

Using front plate 2 having protective film 8 formed by magnesium oxide (MgO) film deposited according to the aforementioned condition, the PDP was manufactured for testing, writing discharge characteristics was evaluated. As an example of writing discharge characteristics, delay time of discharge at the time of writing discharge was measured.

In this example, the partial pressure of water ($H_2O$) and the partial pressure of OH molecular are controlled by partial pressure detecting unit 29c, thereby the PDP deposited the magnesium oxide film is manufactured, and then delay time of discharge was measured with respect to the deposited PDP. When the delay time of discharge is defined a period from the time when voltage is applied between scan electrode 4 and address electrode 11 during address period to the time when discharge occurs, 100 peak values of discharge emission were averaged. In addition, the amount of delay time of discharge was normalized, relative to the values in the PDP (42 inch size) having high definition.

Figure 4:
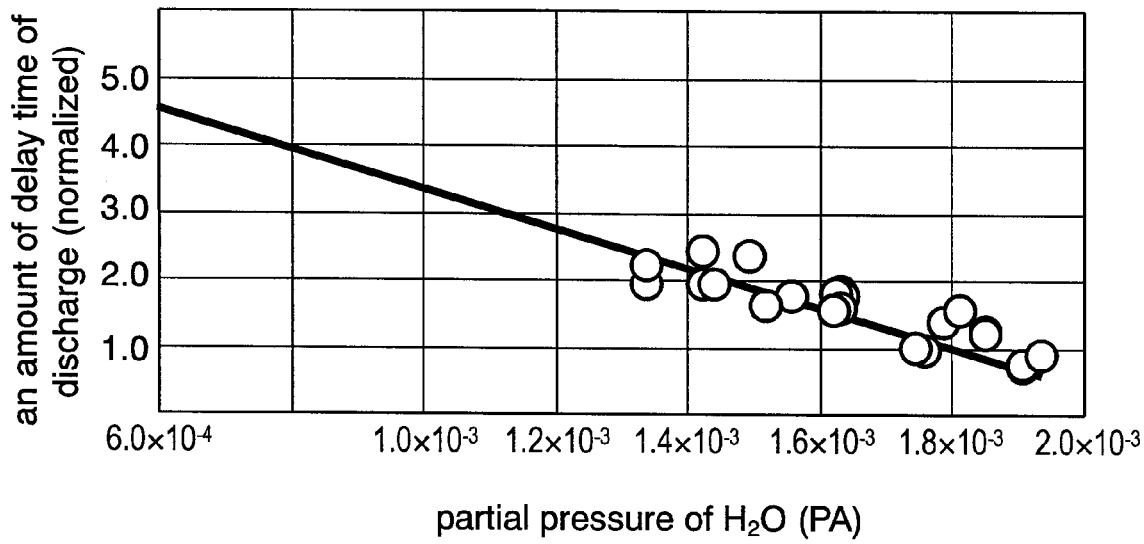
FIG. 4 is a view illustrating a relation between a discharge delay time and a partial pressure of water ($H_2O$), in the PDP manufactured as an example in an embodiment of the invention.
Figure 5:
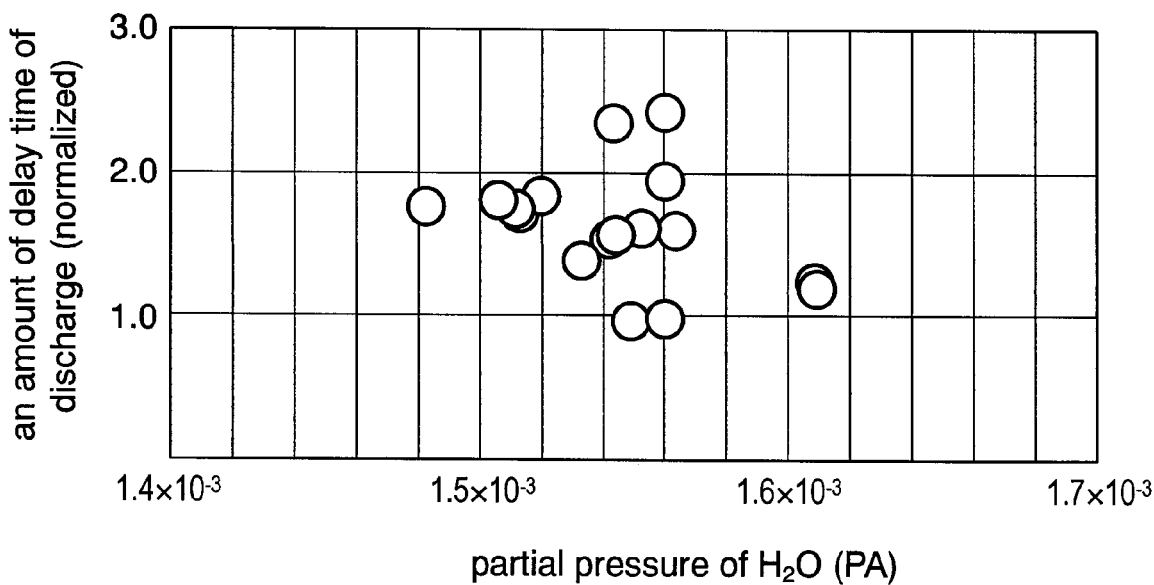
FIG. 5 is a view illustrating a relation between a discharge delay time and a partial pressure of water ($H_2O$), in a PDP manufactured as a comparative example in the embodiment of the invention.

FIG. 4 is a view illustrating a relation between the amount of the delay time in discharge and the partial pressure of water ($H_2O$) in the manufacturing apparatus, in the PDP manufactured as an example in the exemplary embodiment of the invention. FIG. 5 is a view illustrating a relation between an amount of the delay time in discharge and a partial pressure of water ($H_2O$) in a manufacturing apparatus, in a PDP manufactured as a comparative example.

FIG. 4 is shown the result, as the exemplary embodiment of the invention, in the case that as shown in FIG. 2, partial pressure detecting unit 29c is arranged the side of downstream protrusion 21c of evaporation chamber 21, at the downstream of the transport direction of front substrate 3, i.e., the side of outlet for carrying out front substrate 3 in the film forming chamber, and then water ($H_2O$) is introduced from any one of gas introducing units 29a and 29b so that partial pressure of water ($H_2O$) become a predetermined value. In this case, oxygen is introduced from the remainder of gas introducing units 29a and 29b. While the example in which gas introducing units 29a and 29b are arranged at a side of downstream protrusion 21c in the vicinity of partial pressure detecting unit 29c, is illustrated in FIG. 2, in addition to the result of the aforementioned experiment, the result in which the introducing of water ($H_2O$) is performed from an upstream of substrate transport direction of evaporation chamber 21, is illustrated in FIG. 4.

As shown in FIG. 4, it is apparent that when partial pressure detecting unit 29c is arranged at the side of downstream protrusion 21c of evaporation chamber 21 in the downstream of transport direction of front substrate 3 and water ($H_2O$) is introduced so that the partial pressure of water ($H_2O$) reaches to the predetermined value, there exists a correlation between the partial pressure of water ($H_2O$) and an amount of delay time of discharge, regardless of a position that water ($H_2O$) is introduced. In other words, protective film 8 having a predetermined amount of delay time of discharge can be obtained by detecting the partial pressure of water ($H_2O$) in the downstream of evaporation chamber 21, and introducing water ($H_2O$) from any one of the upstream and the downstream of evaporation chamber 21 to obtain the predetermined partial pressure. Accordingly, controlling the partial pressure of water ($H_2O$) enables realizing protective film 8 having desired amount of delay time of discharge.

On the other hand, the result measured in the case that partial detecting unit is arranged in the upstream of transport direction of front substrate 3 in evaporation chamber 21, is illustrated in FIG. 5. As shown in FIG. 5, it is apparent that there is not a correlation between an amount of delay time of discharge and the partial pressure of water ($H_2O$). In other words, it indicates that when the detection of the partial pressure is performed in the upstream of evaporation chamber, it is impossible to control the physical properties of protective film 8 by introduction of water ($H_2O$).

It is apparent from these results that the emission characteristics of the secondary electron in the protective film 8, which dominates discharge characteristics of PDP, is affected by characteristics of the surface layer portion of protective film 8, i.e., deposition condition at the later deposition process, and can be controlled by the partial pressure of gas of evaporation chamber measured in the vicinity of position where the surface layer portion of protective film 8 is deposited.

According to the invention, as shown in FIG. 4, a controlled partial pressure of water ($H_2O$) is preferably not less than $6.0 \times 10^{-4}$ Pa nor more than $2.0 \times 10^{-3}$ Pa. In other words, when an amount of delay time in discharge, normalized relative to the PDP having a high-definition display, exceeds 4.5, if the partial pressure of water ($H_2O$) is less than $6.0 \times 10^{-4}$ Pa, an amount of delay time of discharge even in PDP having standard definition is too much increased, thereby no discharge occurs in the address period and the discharge cell is not lighted. On the other hand, when the partial pressure of water ($H_2O$) exceeds $2.0 \times 10^{-3}$ Pa where delay time of discharge is too short, a leakage of electron charge occurs and thus non-lighting is produced.

In the case of the high-definition type PDP, it is preferable that the partial pressure of water ($H_2O$) is controlled within not less than $1.2 \times 10^{-3}$ Pa nor more than $2.0 \times 10^{-3}$ Pa.

Further, when protective film is deposited, while the case that the partial pressure of water ($H_2O$) is controlled, was illustrated in FIGS. 4 and 5, the delay time of discharge in PDP also can be controlled by introducing water ($H_2O$) to control the partial pressure of OH molecular instead of the partial pressure of water ($H_2O$) and then controlling the emission characteristics of the second electron in protective film. In the case that the partial pressure of OH molecular is controlled, in the high definition type PDP, it is preferable that the partial pressure is not less than $2.0 \times 10^{-4}$ Pa nor more than $1.6 \times 10^{-3}$ Pa.

As described above, while the gas introduced in evaporation chamber 21 includes oxygen, the gas containing water, inert gas and the like, such gas is not limited to 100% of purity, is in the order of, for example, 99.9% of purity, generally available, and also may be the gas containing some impurities.

Furthermore, deposition apparatus 20 is not limited to the structure described above, for example a structure in which at least one substrate heating room for heating front substrate 3 is further provided between substrate loading room 22 and evaporation chamber 21, corresponding to set-up condition of temperature profile of front substrate 3, a structure in which at least one substrate cooling room is further provided between evaporation chamber 21 and substrate unloading room 23 and the like, also may be preferably employed. Further, with respect to a structure in which buffer rooms are provided between each room for tact adjustment etc., a structure in which separate room for heating and cooling is provided, a structure which has arrangement in which deposition is performed in a batch process and the like, the effects equal to those described above can be obtained.

Furthermore, as described above, a case, that the depositing of magnesium oxide (MgO) film on front substrate 3 in evaporation chamber 21 is performed while front substrate 3 is transported, was described as an example. However, the depositing of magnesium oxide (MgO) film on front substrate 3 in evaporation chamber 21 can be performed in a stoppage state in which the transport of front substrate 3 is stopped.

Still further, for a manner that a plurality of gases are introduced into evaporation chamber 21 which is the film forming chamber, a manner that gas introducing units 29a, 29b are provided for every gases respectively and then the gas, as needed is introduced from the provided, corresponding gas introducing unit, and a manner that a separated mixing chamber in which a plurality of gases are mixed in advance is provided and then the gas is introduced after mixing gases in this mixing chamber via gas introducing unit 29a, or the like can be employed.

As described above, while forming protective film 8 by deposition using magnesium oxide (MgO) as raw material was described as an example, the manufacturing processes according to the exemplary embodiment of the invention are not limited to the deposition of magnesium oxide (MgO), but are equally applicable to a case that various metal oxides are deposited, and thereby the same effect can be obtained.

As described above, according to the manufacturing method of PDP of the invention, the gas introducing unit and the partial pressure detecting unit are provided in the film forming chamber of deposition apparatus, the partial pressure of gas within the film forming chamber of the deposition apparatus near the end of deposition is measured by the partial pressure detecting unit and then the gas containing water ($H_2O$) is introduced such that the partial pressure is controlled. As a result, it allows forming the superior protective film having the stable characteristics of electron emission, and realizing PDP having good display quality.

According to the invention, the manufacturing method capable of controlling emission characteristics of secondary electron when the protective film is deposited, can be realized, the method can be advantageously employed as the manufacturing method of the plasma display device having large-sized screen, high definition and good display quality.

The invention claimed is:

1. A method of manufacturing a plasma display panel comprising:
   introducing a substrate, on which a display electrode and a dielectric layer are formed, into a film forming chamber;
   depositing metal oxide successively on a surface of the substrate while the substrate is transported;
   measuring, with a partial pressure detecting unit that is disposed adjacent to an exit of the film forming chamber downstream of a center of a deposition space, a partial pressure of at least one gas of $H_2O$ and OH in the film forming chamber adjacent to the exit of the film forming chamber downstream of the center of the deposition space of the film forming chamber in a transport direction of the substrate while the metal oxide is deposited; and
   controlling an amount of gas containing $H_2O$ that is introduced into the film forming chamber based on the partial pressure to make the partial pressure of OH to be not less than $2.0 \times 10^{-4}$ Pa nor more than $1.6 \times 10^{-3}$ Pa, roughly at the time of completing said depositing.

2. The method of manufacturing a plasma display panel of claim 1,
   wherein the metal oxide is magnesium oxide.

* * * * *